United States Patent [19]

Havemann

[11] Patent Number: 4,635,344
[45] Date of Patent: Jan. 13, 1987

[54] METHOD OF LOW ENCROACHMENT OXIDE ISOLATION OF A SEMICONDUCTOR DEVICE

[75] Inventor: Robert H. Havemann, Garland, Tex.

[73] Assignee: Texas Instruments Incorporated, Dallas, Tex.

[21] Appl. No.: 642,320

[22] Filed: Aug. 20, 1984

[51] Int. Cl.$^4$ .............................................. H01L 21/76
[52] U.S. Cl. .................................. 29/576 W; 427/85; 427/93
[58] Field of Search ............................ 427/85, 88, 93; 29/576 W; 148/DIG. 116, DIG. 118, DIG. 85, DIG. 86

[56] References Cited

U.S. PATENT DOCUMENTS

| | | | |
|---|---|---|---|
| 3,899,372 | 8/1975 | Esch et al. | 148/187 |
| 4,056,825 | 11/1977 | Esch | 357/23 |
| 4,178,396 | 12/1979 | Okano et al. | 427/93 |

OTHER PUBLICATIONS

G. C. Feth et al, "Thin-Base Lateral pnp Transistor Structure", IBM Tech. Disclosure Bul. vol. 22, No. 7, 12/79.

Primary Examiner—John D. Smith
Attorney, Agent, or Firm—Robert Groover, III; Melvin Sharp; N. Rhys Merrett

[57] ABSTRACT

A low temperature, low encroachment isolation technique using differential oxidation results in an isolated semiconductor body having an N+ substrate (12) and an N epi layer (14) forming a mesa. N+ implants (22a) and (22b) are implanted on opposite sides of the mesa. Oxide is grown over the surface of the device with differential oxidation thus resulting in thick regions (24) over the N+ dopant regions and a thin region (26) over the undopant mesa region.

11 Claims, 6 Drawing Figures

METHOD OF LOW ENCROACHMENT OXIDE ISOLATION OF A SEMICONDUCTOR DEVICE

FIELD OF THE INVENTION

This invention relates to semiconductor devices, and more particularly relates to a method of forming oxide isolation for a semiconductor device without oxide encroachment of the device.

DESCRIPTION OF THE PRIOR ART

VLSI technology continues to progress toward higher packing density and improved circuit performance. When scaling VLSI device geometries to a very small degree, device isolation becomes a major designed feature. The local oxidation of silicon (LOCOS) has been previously used as an isolation technique of silicon integrated circuits. However, substantial problems have heretofore arisen with LOCOS due to encroachment into the device active area by the field oxide. This oxide encroachment phenomena, often termed the "bird's beak", essentially limits the active area of the device. In addition, with the LOCOS technique, a nitride masking layer is used which causes stress in the silicon and can create defects. The flexing of this nitride layer during field oxidation encroachment also creates an undesirable topography known as "bird's crest".

Techniques have previously been developed to attempt to eliminate "bird's beak" by utilizing a sidewall $Si_3N_4$ film, as described in "Defect Characteristics And Generation Mechanism In A Bird Beak Free Structure By Sidewall Masked Technique", by Fang et al, *Journal of Electro-Chemicals Society: Solid-State Science and Technology*. Another previously developed technique using thin nitride sidewalls, termed "sidewall masked isolation" (SWAMI), is disclosed in "The Swami-A Defect Free And Near-Zero Bird's Beak Local Oxidation Process And Its Application In VLSI Technology", by Chiu et al, IEDM, 1982, page 224. However, these techniques have not proven to be totally acceptable due to process complexity and defects caused by stress in the silicon generated by the nitride layer.

SUMMARY OF THE INVENTION

In accordance with the present invention, the method of isolating semiconductor devices includes the formation of a mesa or island structure on a semiconductor body having a first conductivity type. An oxide layer is then formed over the top and sidewalls of the mesa. Doped areas of high conductivity material are then formed on the semiconductor body on opposite sides of the mesa. The layer of oxide is removed and a new layer of field oxide is formed over the semiconductor body and the mesa at low temperature, such that a substantially thicker field oxide layer is formed over the highly doped areas than the oxide layer formed over the mesa because of differential oxidation. This enables the formation of a thick recessed field oxide on opposite sides of the mesa without encroachment into the active device region.

DESCRIPTION OF THE DRAWINGS

The present invention will now be better understood by reference to the following description of the invention taken in conjunction with the drawings, in which.

DESCRIPTION OF THE PREFERRED EMBODIMENT

Figure 1:
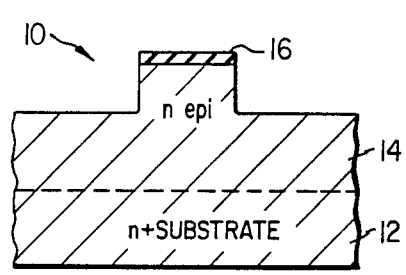
FIG. 1 is a diagrammatical cross-sectional view of a semiconductor device having a mesa structure with an oxide layer.

FIG. 1 illustrates the first state of a VLSI semiconductor device 10 constructed in accordance with the present invention. It will be understood that relative dimensions of the structure being illustrated are not faithfully reproduced in the drawings for ease of illustration. Although the device 10 is shown formed on N type material, it will be understood that P type or various epi-substrate combinations could alternatively be utilized. The illustrated device initially includes an N+substrate 12 formed of conventional semiconductor material, along with an epi layer 14 formed of N conductivity type semiconductor material in accordance with conventional techniques. A silicon oxide layer 16 is initially grown over the entire surface of the N epi layer 14. The desired active device regions of the semiconductor chip are then patterned with resist. The unmasked portions of the oxide and underlying N-type epi 14 are then anisotropically etched by conventional techniques to form the mesa or island structure with oxide layer 16 shown in FIG. 1. Although it will be understood that dimensions will vary in accordance with various desired operating characteristics, in one embodiment of the invention, an initial oxide layer 16 may be provided with a thickness of 2500Å.

Figure 2:
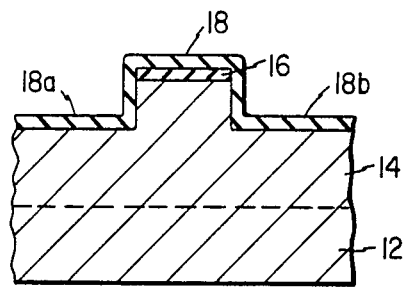
FIG. 2 is a cross-sectional view of the device of FIG. 1 showing the addition of a second oxide layer.

FIG. 2 illustrates the next step of the invention which includes the deposition of a plasma oxide layer 18 over the entire upper surface of the device. Layer 18 may be, for example, 2000Å in thickness. Layer 18 may be seen to cover not only the top and sides of the mesa structure, but the entire top of layer 14 as indicated by oxide portions 18a and 18b.

Figure 3:
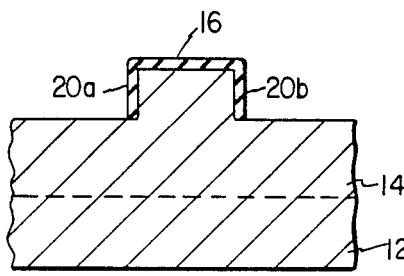
FIG. 3 is a cross-sectional view of FIG. 2 showing the removal of a portion of the second oxide layer.

The oxide layer 18 is then anisotropically etched by conventional technique until the oxide regions 18a and 18b are eliminated. The resulting device is shown in FIG. 3, wherein it may be seen that the entire mesa structure is covered with an oxide layer of substantially equal thickness. Layer 16 covering the top of the mesa structure has been reduced in thickness to approximately 2000Å, while the side portions of the mesa structure are covered by etched layer regions 20a and 20b which also have a thickness of appproximately 2000Å. It will be seen in FIG. 3 that the etching has exposed the upper portion of layer 14 on opposite sides of the mesa structure, except for the small region covered by the oxide layers 20a and 20b. Anisotropic etching enables the formation of the vertical oxide layers 20a and 20b. The etching may be accomplished with any suitable etching medium, such as a $C_2F_6$/He mixture. It will be understood that the thickness of the sidewall regions 20a and 20b may be controlled and adjusted depending upon the implant offset desired, as will subsequently be described.

Figure 4:
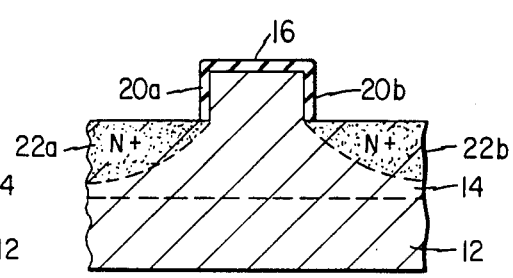
FIG. 4 is a cross-sectional view of FIG. 3 showing the implant of doped regions on opposite sides of the mesa structure.

For the next step of the operation shown in FIG. 4, a suitable dopant is implanted or deposited in the exposed upper regions of the layer 14. A suitable dopant such as arsenic or antimony may be implanted and annealed by temperature by conventional technique to form the regions 22a and 22b as shown in FIG. 4. Alternatively, regions 22a–b could be formed by depositing highly doped regions such as $POCl_3$. The oxide layers 20a and 20b prevent encroachment of the N+ implanted areas 22a and 22b into the mesa structure.

If desired, the thickness of the sidewall oxide regions 20a and 20b could be increased in order to provide greater offset of the implanted regions 22a and 22b from the mesa structure. Although it will be understood that various chemicals could be used to provide the N+ implant shown in FIG. 4, in one embodiment of the invention, $10^{16}$ ions per square centimeter of arsenic or antimony may be implanted into the device using an implant energy of 100 KEV. For the annealing process, when arsenic is used, a temperature of 1000° C. may be used for twenty to thirty minutes. When antimony is used, an annealing process of 1050° to 1100° C. may be used for twenty to thirty minutes.

Figure 5:
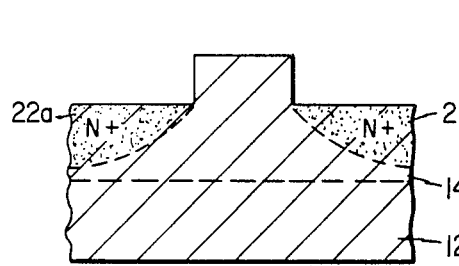
FIG. 5 is a cross-sectional view of FIG. 4 showing the removal of all oxide.

In the next step of operation shown in FIG. 5, all oxide is removed from the device, thereby leaving the entire upper surface of the layer 14, including the mesa structure, exposed for subsequent processing.

Figure 6:
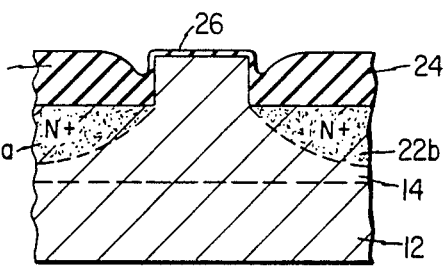
FIG. 6 is a cross-sectional view of FIG. 5 showing the formation of isolating field oxide on the device by differential oxidation.

FIG. 6 illustrates the last step of the invention, wherein an oxidation is accomplished at a low temperature to provide differential oxidation over the device. As is known, the rate of low temperature oxidation over N+ regions will be significantly enhanced over the rate of oxide deposit over undoped regions such as the mesa structure. Consequently, approximately one micron thickness of oxide is grown at areas 24, while a very thin oxide layer 26 of approximately 1000 Å thickness is grown over the mesa structure. In practice, 160 minutes may be required to grow one micron of oxide over the N+ regions 22a and 22b, at a temperature of approximately 800° C. The phenomenon of differential oxidation has been previously known and described in the literature. Using the present invention, the thickness of the oxide layers 24 may be as large as ten to fifteen times the thickness of the oxide over undoped mesa region 26.

FIG. 6 thus illustrates the formation of a field oxide region 24 with substantially no encroachment into the active device region. The present invention is advantageous since no nitride is used to mask the oxidation, so stress at the edges of the device region is substantially reduced. In addition, because of the low temperature used for growth of the oxide, field oxidation does not have to be done at the beginning of the process, but may be delayed to later stages. The use of the present invention does not produce stress and resulting damage and distortion of the devices. The present invention substantially eliminates oxide encroachment or "bird's beak" encountered in standard processes.

The various etching and dopant steps noted above are conventional, and thus have not been described in substantial detail. While the present invention has been described utilizing N+ dopant, it will be understood that the invention should also be utilized with a P-type dopant. However, the differential oxidation of the present invention is not as substantial with a P dopant as when the N+ dopant is used.

Although the preferred embodiment has been described in detail, it should be understood that various changes, substitutions and alterations can be made therein without departing from the spirit and scope of the invention as defined by the appended claims.

What is claimed is:

1. A method of isolating a semiconductor device comprising the steps of:
   (a) providing a semiconductor body of a first conductivity type,
   (b) forming a raised structure having a side wall on said semiconductor body of said first conductivity type,
   (c) forming a first layer of oxide over the top and sides of said raised structure, said semiconductor body being exposed adjacent the sides of said raised structure,
   (d) forming highly doped areas of said first conductivity type in the exposed regions of said semiconductor body extending to said raised structure, and
   (e) forming a second layer of oxide over said raised structure and over said doped areas at a temperature such that the rate of oxidation over said doped areas greatly exceeds the rate of oxidation over said raised structure in order to form a thick recessed field oxide adjacent said raised structure without encroachment into the active device region.

2. The method of claim 1 wherein the thickness of said second layer of oxide is at least ten times as thick adjacent said raised structure as on the upper portion of said raised structure.

3. The method of claim 2 wherein said second layer of oxide is formed at a temperature of about 800° C.

4. The method of claim 1 wherein said first layer of oxide is patterned over said raised structure by anisotropic etching.

5. The method of claim 1 wherein said first type conductivity comprises N type and said highly doped areas are formed from N+ type material.

6. The method of claim 5 wherein said second layer of oxide is formed at a temperature of about 800° C.

7. The method of claim 1 further including the step of removing said first layer of oxide from said raised structure prior to forming said second layer of oxide in step (e).

8. The method of claim 7 wherein said second layer of oxide is formed at low temperatures less than about 850° C.

9. The method of claim 7 wherein said second layer of oxide is formed at a temperature of about 800° C.

10. The method of claim 7 wherein said first layer of oxide is patterned over said raised structures by anisotropic etching.

11. The method of claim 7 wherein said first type conductivity comprises N type and said highly doped areas are formed from N+ type material.

* * * * *